United States Patent
Meunier-Bellard et al.

(10) Patent No.: US 8,216,908 B2
(45) Date of Patent: Jul. 10, 2012

(54) EXTENDED DRAIN TRANSISTOR AND METHOD OF MANUFACTURING THE SAME

(75) Inventors: Phillippe Meunier-Bellard, Kortenberg (BE); Anco Heringa, Waalre (NL)

(73) Assignee: NXP B.V., Eindhoven (NL)

(*) Notice: Subject to any disclaimer, the term of this patent is extended or adjusted under 35 U.S.C. 154(b) by 277 days.

(21) Appl. No.: 12/665,723

(22) PCT Filed: Jun. 19, 2008

(86) PCT No.: PCT/IB2008/052414
§ 371 (c)(1),
(2), (4) Date: Dec. 20, 2009

(87) PCT Pub. No.: WO2009/001252
PCT Pub. Date: Dec. 31, 2008

(65) Prior Publication Data
US 2010/0181618 A1    Jul. 22, 2010

(30) Foreign Application Priority Data
Jun. 27, 2007  (EP) ................................ 07111138

(51) Int. Cl.
*H01L 21/336*    (2006.01)
(52) U.S. Cl. ........ 438/305; 438/303; 438/304; 438/306; 257/900; 257/E21.626; 257/E21.64
(58) Field of Classification Search .................. 438/303, 438/304, 305, 306; 257/E21.626, E21.64, 257/900
See application file for complete search history.

(56) References Cited

U.S. PATENT DOCUMENTS

| | | | |
|---|---|---|---|
| 5,547,885 A | 8/1996 | Ogoh | |
| 5,828,104 A | 10/1998 | Mizushima | |
| 5,866,460 A | 2/1999 | Akram et al. | |
| 5,918,128 A * | 6/1999 | Gardner et al. | 438/286 |
| 5,923,982 A | 7/1999 | Kadosh et al. | |
| 5,930,631 A * | 7/1999 | Wang et al. | 438/286 |
| 6,078,080 A | 6/2000 | Kadosh et al. | |
| 2002/0106859 A1 * | 8/2002 | Odake et al. | 438/264 |

FOREIGN PATENT DOCUMENTS

| | | |
|---|---|---|
| EP | 0160255 A | 11/1985 |
| JP | 06 326122 A | 11/1994 |

OTHER PUBLICATIONS

Yan, T. et al.; "Cost-effective integrated RF Power Transistor in 0.18-μm CMOS Technology"; IEEE Electron Device Letters, vol. 27, No. 10; 2006; p. 586.

* cited by examiner

*Primary Examiner* — Matthew E Warren
*Assistant Examiner* — David Chen

(57) ABSTRACT

An extended drain transistor (100) comprising a substrate (101), a gate (103) formed on the substrate (100), the gate (103) having a first side wall (104) and a second side wall (105) opposing the first side wall (104), an extended drain (106) implanted in a surface portion of the substrate (101) adjacent the second side wall (105) of the gate (103), a spacer (107) on the second side wall (105) of the gate (103), a source (108) implanted in a surface portion of the substrate (101) adjacent the first side wall (104) of the gate (103), and a drain (109) implanted in a surface portion of the substrate (101) adjacent the spacer (107) in such a manner that the extended drain (106) is arranged between the gate (103) and the drain (109).

18 Claims, 7 Drawing Sheets

EXTENDED DRAIN TRANSISTOR AND METHOD OF MANUFACTURING THE SAME

FIELD OF THE INVENTION

The invention relates to an extended drain transistor.

Moreover, the invention relates to a method of manufacturing an extended drain transistor.

Beyond this, the invention relates to an RF circuit.

BACKGROUND OF THE INVENTION

In semiconductor technology, the efficient manufacture of MOS transistors is essential. Particularly for RF applications, the demand on the quality of transistors increases.

U.S. Pat. No. 5,828,104 discloses a MOS semiconductor device containing a MOSFET with an asymmetric LDD structure, which has in a semiconductor substrate a first heavily doped region, a lightly doped region formed adjacent to the first heavily doped region, and a second heavily doped region formed apart from the first lightly doped region. The first heavily doped region and the lightly doped region act as a drain region of the MOSFET, and the second heavily doped region acts as a source region thereof. A gate electrode composed of a plurality of parts is positioned over a channel region. At least one of the parts has a drain-side end, which is positioned over the lightly doped region, and a source-side end that is positioned over the channel region not to extend to the second heavily doped region.

However, conventional transistor manufacture procedures may fail when the dimensions become smaller and smaller.

OBJECT AND SUMMARY OF THE INVENTION

It is an object of the invention to provide a transistor architecture that is appropriate for small dimensions.

In order to achieve the object defined above, an extended drain transistor, a method of manufacturing an extended drain transistor, and an RF circuit according to the independent claims are provided.

According to an exemplary embodiment of the invention, a method of manufacturing an extended drain transistor (for instance an EDMOS field effect transistor) is provided, the method comprising forming a gate on a substrate, forming a first spacer (for instance exclusively) on a first side wall of the gate, implanting an extended drain in a surface portion of the substrate adjacent a second side wall of the gate opposing the first side wall and being uncovered (that is to say being not covered) by the first spacer, removing the first spacer, forming a second spacer (for instance exclusively) on the second side wall of the gate, implanting a source in a surface portion of the substrate adjacent the first side wall of the gate being uncovered (that is being not covered) by the second spacer, and implanting a drain in a surface portion of the substrate adjacent the second spacer.

According to another exemplary embodiment of the invention, an extended drain transistor is provided, the extended drain transistor comprising a substrate, a gate formed on the substrate, the gate having a first side wall and a second side wall opposing the first side wall, an extended drain implanted in a surface portion of the substrate adjacent the second side wall of the gate, a spacer on the second side wall of the gate, a source implanted in a surface portion of the substrate adjacent the first side wall of the gate, and a drain implanted in a surface portion of the substrate adjacent the spacer in such a manner that the extended drain is arranged (particularly laterally, i.e. in a horizontal direction) between the gate and the drain.

According to still another exemplary embodiment of the invention, an RF (radio frequency) circuit is provided, the RF circuit comprising an extended drain transistor having the above-mentioned features.

The term "substrate" may denote any suitable material, such as a semiconductor, glass, plastic, etc. According to an exemplary embodiment, the term "substrate" may be used to define generally the elements for layers that underlie and/or overlie a layer or portions of interest. Also, the substrate may be any other base on which a layer is formed, for example a semiconductor wafer such as a silicon wafer or silicon chip.

The term "field effect transistor" (FET) may denote a transistor in which an output current (source-drain current) may be controlled by the voltage applied to a gate, which may be an MOS structure (MOSFET), a p-n junction (JFET), or metal-semiconductor contact (MESFET).

The term "extended drain transistor" (EDMOS) may particularly denote a transistor having a drain extension between a channel region and a drain region. By means of such an extension, the drain may be shifted to a remote location. A drain extension may be a low doping extension of the drain towards the channel, carried out by ion implantation, and used in advanced CMOS particularly to prevent premature breakdown of a drain-substrate junction. The drift region may be designed using the well known Reduced Surface Field principle (RESURF). According to this principle the highest breakdown voltage is obtained with an optimum doping concentration (Next) and layer thickness (text) with Next. text~$10^{12}$ atoms/cm$^2$. Typical concentrations of charge carriers in the extended drain may be in an interval between $10^{17}$ atoms/cm$^3$ and $10^{19}$ atoms/cm$^3$.

The term "source" may particularly denote a heavily doped region from which majority carriers are flowing (or transported) into the channel. Typical concentrations of charge carriers in the source region may be in an interval between $10^{19}$ atoms/cm$^3$ and $10^{21}$ atoms/cm$^3$.

The term "drain" may particularly denote a heavily doped region in semiconductor substrates located at the end of the channel in field effect transistors, wherein carriers are flowing out of the transistor through the drain. Typical concentrations of charge Carriers in the drain region may be in an interval between $10^{19}$ atoms/cm$^3$ and $10^{21}$ atoms/cm$^3$.

The term "lightly doped drain" (LDD) may particularly denote a part of the drain engineering strategy in advanced CMOS designed to reduce or minimize hot-carrier effects so that the reduced doping gradient between drain and channel lowers an electric field in the channel in the vicinity of the drain. For implementation of an LDD, a moderate implant may be performed before spacer formation, and a heavy implant after spacer formation. The term "lightly doped source" may denote a corresponding provision at the source. Typical concentrations of charge carriers in the lightly doped source or in the lightly doped drain may be in an interval between $10^{19}$ atoms/cm$^3$ and $10^{21}$ atoms/cm$^3$. A LDD and a highly doped drain (HDD) may have about the same (top) concentration around 1 to 5 $10^{20}$ atoms/cm$^3$. In order to put some numbers for the C065-C032 generations, the poly-gate is about 100 nm thick, the spacer width is around 30 nm, the LDD and HDD junction depths are around 20 nm and 80 nm respectively.

Although the description of this application distinguishes between a "source" and a "drain", these components may also be denoted as first and second source/drain regions. In other words, changing a polarity of applied voltages may reverse the functionality of source and drain.

The term "gate" may denote an electrically conductive structure to which an electric voltage may be applied to control a conductivity of a channel region of a semiconductor substrate. In the context of this application, the term gate may cover such an electrically conductive structure individually, or the electrically conductive structure with at least one electrically insulating component connected thereto. Thus, also a gate stack may be covered by the term "gate".

The term "RF circuit" may denote an electronic circuit for processing signals in the radio frequency domain, particularly for frequencies above 100 GHz. Examples for RF applications are cellular phones, broadcasting systems, or transponders. RF circuitry may denote the technical field of electronic circuits, particularly of monolithically integrated circuits, for radio frequency applications. In this context, the RF domain may cover frequencies from several MHz up to 100 GHz and more (that is a high-frequency domain, a microwave domain, etc.). Applications of exemplary embodiments of the invention may involve RF power CMOS applications. Transistors according to exemplary embodiments may also be used for DC/DC converters.

According to an exemplary embodiment of the invention, a self-aligned EDMOS formation may be provided so that a self-aligned asymmetrically MOS device containing gate oxides and at least one drain extension may be provided. According to an exemplary embodiment, a single poly gate may be used for manufacturing such an asymmetrical field effect transistor. Particularly, the asymmetrical transistor according to an exemplary embodiment of the invention may be appropriate for small poly gate lengths, particularly below 100 nm. By taking this measure, a lower doping at the drain side may lower undesired hot carrier effects.

According to an exemplary embodiment of the invention, a method of manufacturing a transistor device is provided, the method comprising the steps of forming a gate oxide/poly gate/nitride layer structure, depositing an oxide/nitride/oxide stack, forming a first oxide spacer, whereby the sum of the gate length and the spacer width is larger than the lithography overlay of the CMOS process technology used for forming the gate structure, forming a drain extension, defining a second oxide spacer on the drain extension, and recessing the oxide spacer on the drain extension to a required drain extension length.

According to an exemplary embodiment, a simple and efficient way of manufacturing a drain extension aligned with a gate may be provided which may advantageously combine spacer deposition technology with lithography and etching procedures. By providing an extension exclusively on the drain side, not on the source side, it may be securely prevented that a gate insulating layer is destroyed or deteriorated by hot carriers. The extended drain in this case reduces the electric field between the gate and the drain. Such an extended drain transistor may have a proper performance particularly in RF applications, and may be manufactured advantageously with a low number of masks. Since the spacer thickness may be defined by deposition and/or etching techniques instead of a pure lithography technique, high spatial accuracy may be obtained. Since the device may be manufactured in a miniature manner, silicon area may be saved.

Embodiments of the invention may allow to use spacers and structures which are asymmetric, thereby having accurate alignment on the spacers at a scale which is smaller than the lithographic overlay alignment. In other words, a short gate length may be obtained without silicidation issues, and a small and well controlled drain extension may be obtained. This may allow to slightly increase the voltage breakdown without degrading too much the RF performance.

According to an exemplary embodiment, a self-aligned EDMOS formation is provided, wherein an EDMOS transistor may be manufactured with a drain extension being self-aligned with the gate.

In the following, some recognitions of the inventors will be explained based on which exemplary embodiments of the invention have been developed.

A lot of effort has been spent in research and development in order to develop CMOS technology for logic applications. The aggressive gate length downscaling has shown that CMOS transistors can now reach new frequency domains previously reserved for bipolar transistors. However, it is rather difficult to obtain RF power in CMOS technology due to the low breakdown of these devices. The Crolles alliance is implementing two types of devices in order to improve the breakdown. This involves Drift MOS and EDMOS transistors (see FIG. 2 and FIG. 3). The separated drain device such as the Drift MOS is well suited for 10 V applications, whereas the extended drain devices such as the EDMOS may be preferred for applications less than 10 V.

The lateral dimensions of these devices are determined by lithography overlay, which is around 50 nm in C065. This overlay uncertainty is typically the gate length dimension required for high RF performance. High RF performance may be obtained with a short gate length (and drain extension), low gate resistance and low capacitance.

According to exemplary embodiments of the invention, a method of manufacturing a transistor is provided, which has a proper RF power performance (frequency higher than 100 GHz with a breakdown around 5 V) with a gate length smaller than 100 nm and a drain extension length around 100 nm.

Drift MOS may have a poor RF performance, and it is not straightforward (if not impossible) to implement Drift MOS transistors on SOI (Silicon On Insulator) wafers with fully or partially depleted CMOS devices, that is a technology with thin silicon where the STI (Shallow Trench Insulation) touches the box oxide.

Extended drain-like devices are a promising approach for RF applications. The drain extension length is usually long enough such that the lithography overlay direction is negligible. The silicidation of the drain extension is prevented by patterning an oxide layer (RPO or LOC SAL or SiPROT). The overlay with the gate partially avoids the silicidation of the poly gate. The typical gate length and the drain extension in the technology generation C065 are 250 nm and 300 nm, respectively. The total typical length of two transistors with a common drain is roughly 1.8 μm (STI around 100 nm+p–body contact around 100 nm+STI around 100 nm+source around 100 nm+spacer around 50 nm+gate length around 250 nm+extension length around 300 nm+drain around 100 nm+extension length around 300 nm+gate length around 250 nm+spacer around 50 nm+source around 100 nm).

According to an exemplary embodiment of the invention, a method of making an extended drain self-aligned to the gate is provided. Exemplary embodiments of the invention may have the advantage that the gate length may be made short without silicidation issues. Both parameters (small gate length and low gate resistance) are key aspects to achieve a high RF performance. Furthermore, it is possible to obtain a well-controlled drain extension. This may allow to slightly increase the voltage breakdown without degrading too much the RF performance. The total length of two transistors with a common drain may be roughly 1.0 μm (STI around 100 nm+p–body contact around 100 nm+STI around 100 nm+source around 100 nm+spacer around 50 nm+gate length around 50 nm+extension length around 100 nm+drain around 100 nm+extension length around 100 nm+gate length around 50 nm+spacer around 50 nm+source around 100 nm). Thus, the self-aligned device may require roughly 50% less silicon area than conventional approaches.

Therefore, according to an exemplary embodiment of the invention, a MOS asymmetry may be obtained by combining spacer and lithography. Exemplary aspects of such embodiments are:
- make spacers after gate patterning. The total gate length and spacer width may have to be longer than the lithography overlay
- use a mask to remove dedicated silicon oxide spacer and create a drain extension
- make a spacer on the drain extension in order to prevent the silicidation.

Next, further exemplary embodiments of the method of manufacturing an extended drain transistor will be explained. However, these embodiments also apply to the extended drain transistor and to the RF circuit.

The method may comprise forming a first shallow trench isolation and a second shallow trench isolation in the substrate, wherein the source, the channel, the extended drain and the drain are arranged to be laterally limited between the first shallow trench isolation and the second shallow trench isolation. By taking this measure, an extended field effect transistor may be properly isolated electronically regarding neighboured EDMOS devices. Therefore, a high integration density may be obtained without undesired crosstalk.

Forming the first spacer on the first side wall of the gate may comprise depositing spacer material on the first side wall and on the second side wall of the gate, depositing a resist on the substrate, on the gate (stack) and on the spacer material, removing the resist to expose at least a portion of the gate (stack) and spacer material covering the second side wall of the gate while maintaining the resist on the first side wall of the gate, and etching the exposed spacer material on the second side wall of the gate. By taking this measure, an asymmetric spacer may be formed selectively/only on the first side wall of the gate, whereas at the end of the procedure, the second side wall of the gate may be free of such a spacer. This may form the basis for a subsequent generation of an extended drain region.

Forming the second spacer on the second side wall of the gate (after a previous formation of the extended drain and removal of the first spacer) may comprise depositing further spacer material on the first side wall and on the second side wall of the gate, depositing a further resist on the substrate, on the gate and on the further spacer material, removing the resist to expose at least a portion of the gate and spacer material covering the first side wall of the gate while maintaining the resist on the second side wall of the gate, and etching the exposed spacer material on the first side wall of the gate. Taking this measure may allow to generate a spacer on the second side wall, while having the first side wall free of the spacer material. This may form the basis for an implantation of a lightly doped source and drain or highly doped source and drain at a proper position.

Still referring to the previously described embodiment, the method may further comprise removing the remaining portion of the further resist, and only partially (not entirely) etching the exposed spacer material on the second side wall of the gate to thereby adjust a width/thickness of the second spacer on the second side wall of the gate. By taking this measure, an easy and straightforward method may be provided for defining the extension of the drain and indirectly of the extended drain. By simply selecting the etching time, the remaining lateral width of the second sidewall may be adjusted accurately, thereby defining the dimensions of the drain and extended drain.

The method may further comprise forming a gate insulating layer between the substrate and the gate. Such a gate insulation layer may be made of silicon oxide or silicon nitride and may be electrically insulating to provide the basis for the field effect, that is to allow to control conductivity of the channel by applying a voltage to the gate.

The method may comprise forming an electrically insulating structure between the gate and at least one of the group consisting of the first spacer and the second spacer. Such an electrically insulating layer or structure, which may be made of silicon nitride, may insulate the gate regarding to the spacers, and may improve the protection of the gate regarding the remaining procedures which might deteriorate the functionality of the gate.

Implanting the source may comprise forming a lightly doped source portion in the surface portion of the substrate adjacent to the first side wall of the gate, forming a third spacer selectively/only on the first side wall of the gate, and forming a highly doped source portion in a surface portion of the substrate adjacent the third spacer on the first side wall of the gate. Thus, by using an additional spacer formation, the source may be formed comprising two portions.

In an analogous manner, implanting the drain may comprise forming a lightly doped drain portion in the surface portion of the substrate adjacent the second spacer, forming a third spacer on the second spacer, and forming a highly doped drain portion in a surface portion of the substrate adjacent the third spacer on the second spacer. The third spacer may thus space the lightly doped drain portion with respect to the highly doped drain portion The lightly doped source portion and the lightly doped drain portion may be formed by a common implantation procedure. Furthermore, it is possible that also the highly doped source portion and the highly doped drain portion are formed by a common implantation procedure. Therefore, by doping the respective two portions in a simultaneous procedure, the effort for manufacturing the EDMOS device may be reduced.

The extended drain may be implanted in a surface portion of the substrate directly adjacent (that is abutting to) the second side wall of the gate, and the source may be implanted in a surface portion of the substrate directly adjacent (that is abutting to) the first side wall of the gate. Furthermore, the drain may be implanted in a surface portion of the substrate directly adjacent (that is abutting to) the second spacer. In other words, the "direct" neighbourship may denote the fact that there is no or essential no intermediate portion in between the two directly connected components.

A width of the second spacer may be larger than the lithography overlay of a CMOS process technology used for forming the gate (see FIG. 10). By taking this measure, the dimension of the extended drain may be adjusted accurately.

The extended drain transistor may be manufactured in an asymmetric manner so that a doping profile of the source lacks mirror-symmetry to a doping profile of the drain. Particularly, the extended drain transistor may be manufactured so that the source is free of an extension. While the final transistor may be essentially symmetric regarding the total width of the spacers on both sidewalls (see FIG. 22), the doping profile in the substrate/well may be asymmetric, since there is no analogon to the extended drain on the source side.

The drain may comprise a lightly doped drain portion and a highly doped drain portion, wherein the lightly doped drain portion may be arranged between the extended drain and the highly doped drain portion. The source may comprise a lightly doped source portion and a highly doped source portion, wherein the lightly doped source portion may be arranged between a channel region of the substrate and the highly doped source portion. On the drain side, the dopant concentration of the highly doped drain portion may be larger than the dopant concentration of the lightly doped drain portion that, in turn, may be larger than the dopant concentration of the extended drain. In a similar manner, on the source side, the dopant concentration of the highly doped source portion may be larger than the dopant concentration of the lightly doped source portion. Thus, a three-step structure may be present on the drain side, and a two-step structure may be present on the source side.

The device may be manufactured in CMOS technology. Any CMOS technology generation may be used. When using CMOS technology, a known and cheap method may be used for manufacturing the transistor.

The substrate may be a semiconductor substrate. The transistor device may be monolithically integrated in the semiconductor substrate, particularly comprising one of the group consisting of a group IV semiconductor (such as silicon or germanium), and a group III-group V semiconductor (such as gallium arsenide).

For any method step, any conventional procedure as known from semiconductor technology may be implemented. Forming layers or components may include deposition techniques like CVD (chemical vapour deposition), PECVD (plasma enhanced chemical vapour deposition), ALD (atomic layer deposition), or sputtering. Removing layers or components may include etching techniques like wet etching, plasma etching, etc., as well as patterning techniques like optical lithography, UV lithography, electron beam lithography, etc.

Embodiments of the invention are not bound to specific materials, so that many different materials may be used. For conductive structures, it may be possible to use metallization structures, silicide structures or polysilicon structures. For semiconductor regions or components, crystalline silicon may be used. For insulating portions, silicon oxide or silicon nitride may be used.

The transistor may be formed on a purely crystalline silicon wafer or on an SOI wafer (Silicon On Insulator).

Any process technologies like CMOS, BIPOLAR and BICMOS may be implemented.

The aspects defined above and further aspects of the invention are apparent from the examples of embodiment to be described hereinafter and are explained with reference to these examples of embodiment.

BRIEF DESCRIPTION OF THE DRAWINGS

The invention will be described in more detail hereinafter with reference to examples of embodiment but to which the invention is not limited.

DESCRIPTION OF EMBODIMENTS

Figure 1:
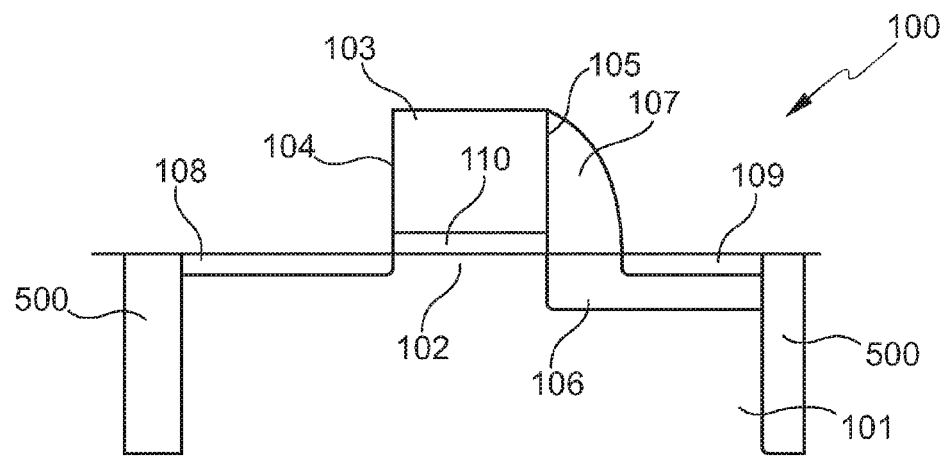
FIG. 1 illustrates an extended drain transistor according to an exemplary embodiment of the invention.

The illustration in the drawing is schematical. In different drawings, similar or identical elements are provided with the same reference signs.

In the following, referring to FIG. 1, an EDMOS transistor 100 according to an exemplary embodiment of the invention will be explained.

The EDMOS transistor 100 is monolithically integrated in a silicon substrate 101. The silicon substrate 101 may be essentially free of any dopant or may be intrinsically doped to thereby form a channel region 102 in a central portion thereof.

The EDMOS transistor 100 further comprises a poly silicon gate 103 formed on the silicon substrate 101, wherein the gate 103 has a first vertical side wall 104 and has a second vertical side wall 105 opposing the first side wall 104. The EDMOS transistor 100 comprises an extended drain region 106, that is a region with a low dopant concentration, implanted in a surface portion of the silicon substrate 101 directly adjacent the second side wall 105 of the gate 103. Furthermore, a spacer 107 (also referred to as the second spacer) formed of silicon oxide material is formed on the second sidewall 105 of the gate 103. A source region 108 which may also be denoted as a first source/drain region is implanted in a surface portion of the silicon substrate 101 directly adjacent the first side wall 104 of the gate 103. Furthermore, a drain region 109 which may also be denoted as a second source/drain region is implemented in a surface portion of the silicon substrate 101 adjacent the second spacer 107 in such a manner that the extended drain 106 is arranged between the gate 103 and the drain 109.

A gate insulating layer 110 (which may also be denoted as a gate oxide) is provided between the intrinsically doped channel region 102 of the silicon substrate 101 on the one hand and the gate 103 on the other hand. An STI (shallow trench insulation) structure 500 is integrated in the substrate 101, and spatially confines the active components of the EDMOS transistor 100.

Figures 2, 3:
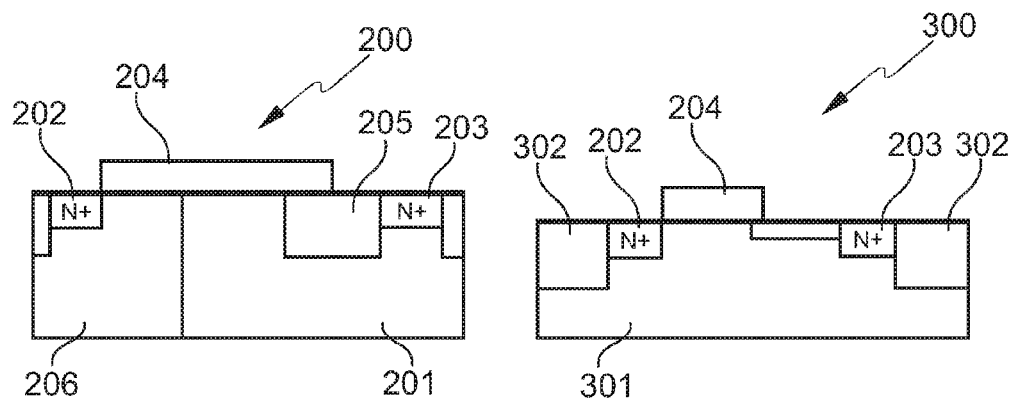
FIG. 2 and FIG. 3 illustrate conventional transistors.

FIG. 2 shows a conventional Drift transistor 200 having an n-drift region 201, an n+ source region 202, an n+ drain region 203, a gate region 204, a shallow trench insulation 205, and a substrate region 206.

A conventional EDMOS transistor 300 is shown in FIG. 3 and comprises a silicon substrate 301, a shallow trench insulation 302, a source region 202, a drain region 203, and a gate region 204.

However, the conventional Drift MOS 200 and the conventional EDMOS 300 lack performance for RF applications and may involve a high manufacturing effort.

In the following, referring to FIG. 4 to FIG. 22, a method of forming an extended drain transistor according to an exemplary embodiment of the invention will be explained.

Figure 4:
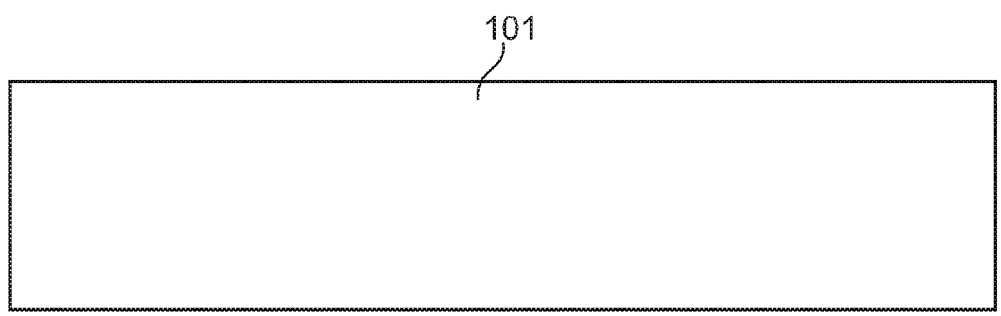
FIG. 4 to FIG. 22 show layer sequences obtained during a method of manufacturing an extended drain transistor according to an exemplary embodiment of the invention.

FIG. 4 shows a standard silicon bulk wafer (p-type) 101.

Figure 5:
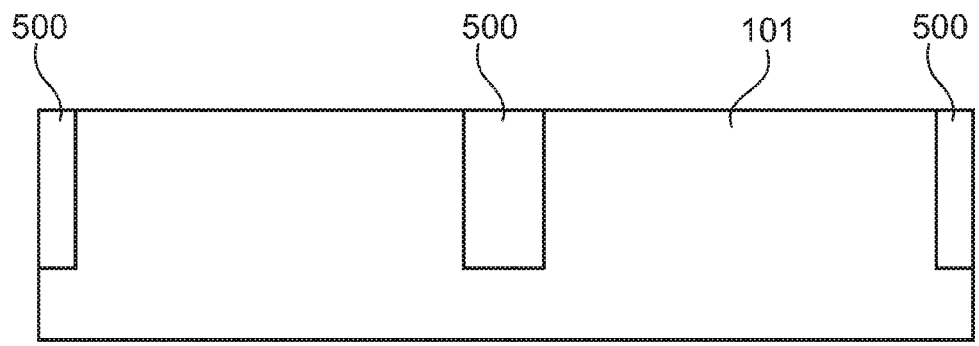

As can be taken from FIG. 5, a shallow trench insulation 500 is formed in various surface portions of the silicon substrate 101. Thus, FIG. 5 illustrates a standard STI isolation 500 as well as a well formation.

Figure 6:
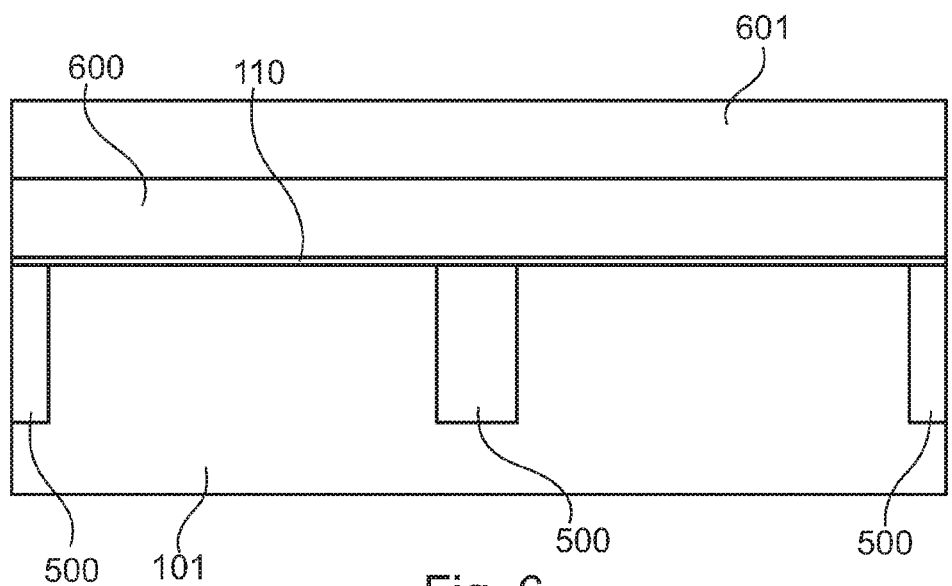

As can be taken from FIG. 6, a gate oxide layer 110 is deposited on the layer sequence shown in FIG. 5, followed by a deposition of a poly gate layer 600 and a deposition of a silicon nitride hard mask 601. Thus, FIG. 6 shows the generation of a standard gate oxide (G01 and G02) 110 and a poly gate 600 deposition. The nitride hard mask 601 is used for clarity purposes. The thickness of the nitride hard mask 601 has to be thick enough in order to further process silicon oxide spacers that are wider than the lithography overlay and wider than the required extended drain length. The use of a silicon oxide hard mask (like in C065) may only change the silicon oxide etch step shown below and avoid the silicon nitride etch step shown below. The gate oxide layer 110 has a thickness of 5 nm, the poly gate layer 600 has a thickness of 100 nm, and the silicon nitride layer 601 has a thickness of 100 nm.

Figure 7:
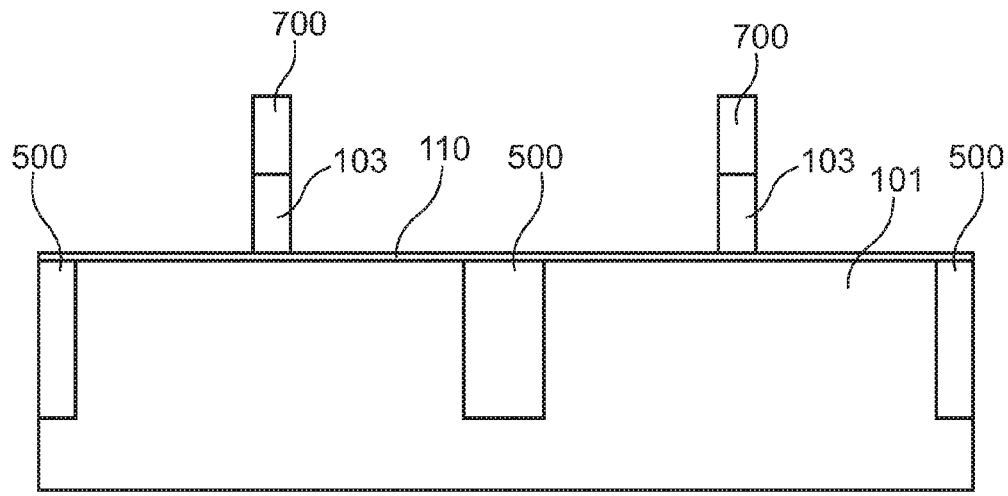

In order to obtain the layer sequence shown in FIG. 7, the layers 600, 601 are patterned using a gate patterning procedure, that is to say implementing a photolithography, etch and strip procedure. As a consequence, the gate 103 is formed covered by a silicon nitride structure 700. The CMOS process is modified significantly after the gate patterning, as shown in FIG. 7. An oxide/nitride/oxide stack 800 to 802 deposition shown in FIG. 8 is performed subsequently.

Figure 8:
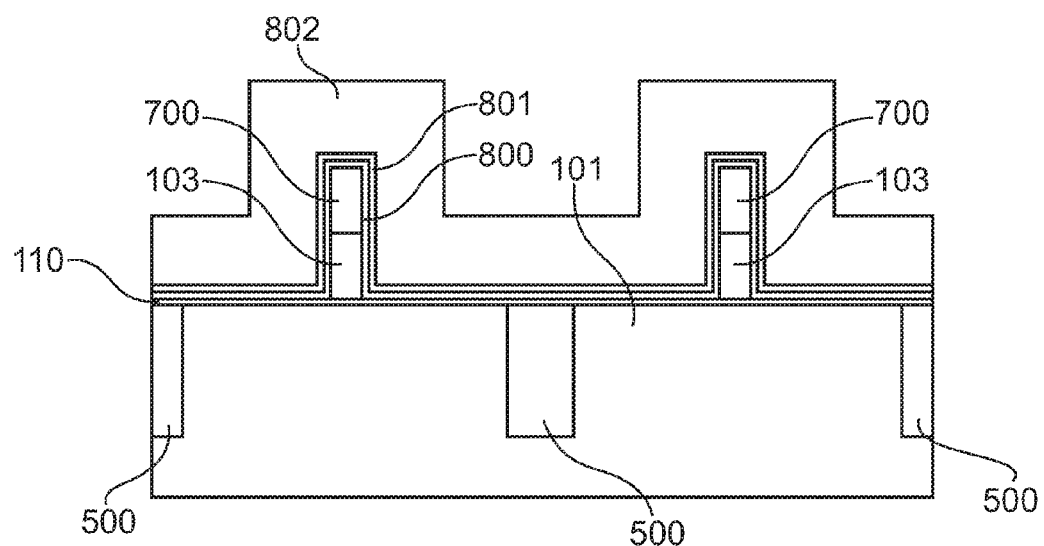

In order to obtain the layer sequence shown in FIG. 8, a silicon oxide layer 800, a silicon nitride layer 801 and a silicon oxide structure 802 are formed. The silicon oxide structure 800 has a thickness of 3 nm, the silicon nitride structure 801 has a thickness of 3 nm, and the silicon oxide structure 802 has a thickness of 150 nm.

Figure 9:
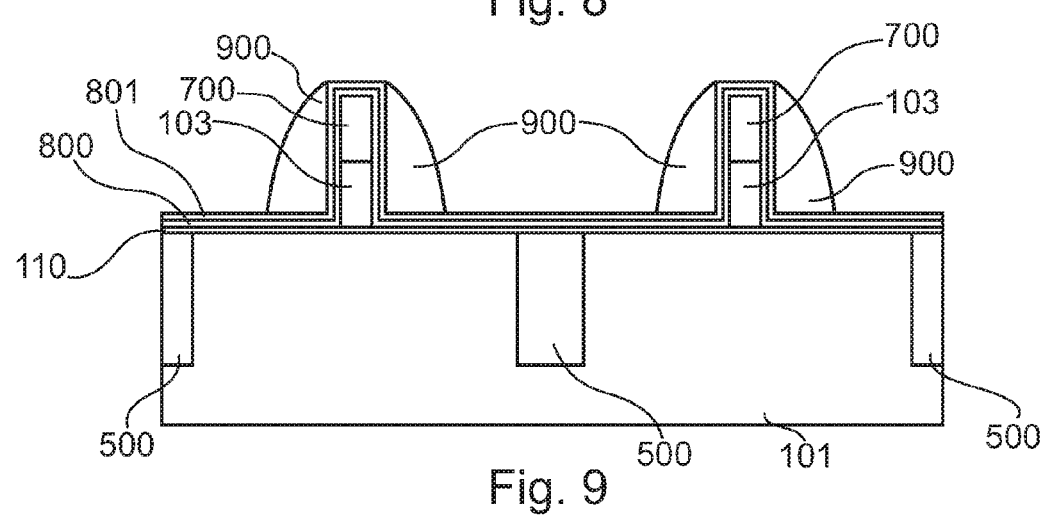

As can be taken from FIG. 9, first oxide spacers 900 are generated by etching the layer 802 using a silicon oxide etch stop on the silicon nitride 801.

Figure 10:
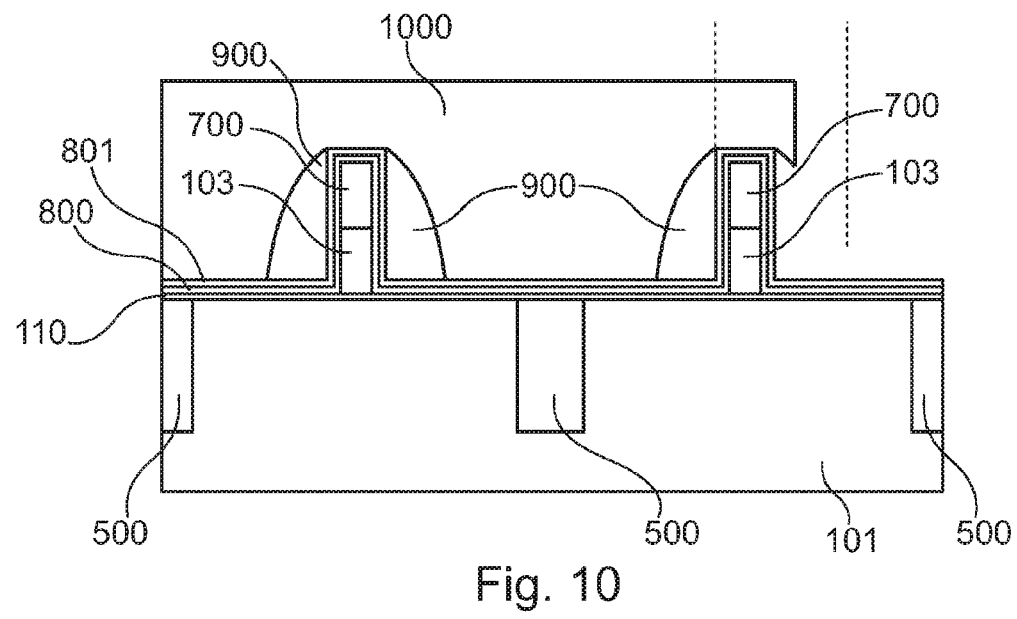

As can be taken from FIG. 10, a resist 1000 is applied on the surface of the layer structure shown in FIG. 9, and resist spinning, exposure and wet oxide etching is performed, thereby removing one of the first spacers 900 on the gate stack on the right hand side.

As can be taken from FIG. 10, the resist 1000 is used in order to select and make the device asymmetric. The position of the resist 1000 has to lay between the two dotted lines in FIG. 10. The width between these two lines roughly equals the gate length (approximately 50 nm) plus the spacer width (approximately 200 nm) minus the small opening to perform the oxide etch (around 50 nm). The width of roughly 200 nm is well larger than the lithography overlay of about 50 nm in C065. The exposed oxide spacer 900 on the right-hand side is removed using a wet oxide etch. The wet oxide etch stops on silicon nitride so that a "long" wet etch can be used in order to fully remove the spacer independently of the resist 1000 position.

Figure 11:
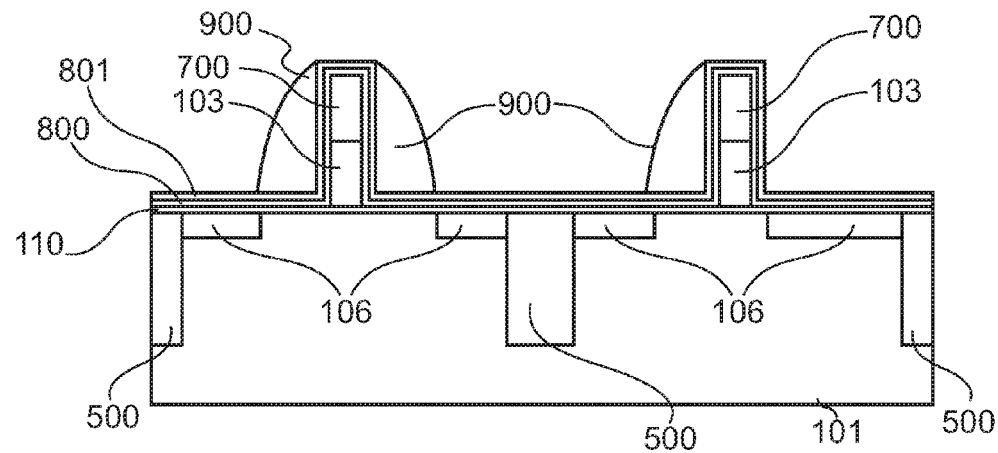

In order to obtain the layer sequence shown in FIG. 11, the resist 1000 is stripped, and an extended drain implantation 106 is performed subsequently. Thus, the resist 1000 is removed and the extended drain implant 106 is performed, wherein the extension region is usually shallower than the source and drain implant. The unwanted drain extension implant will be later overdoped by the source and drain implant. The extended drain 106 may have charge carrier density of, for instance, $10^{12}$ atoms/cm$^2$.

Figure 12:
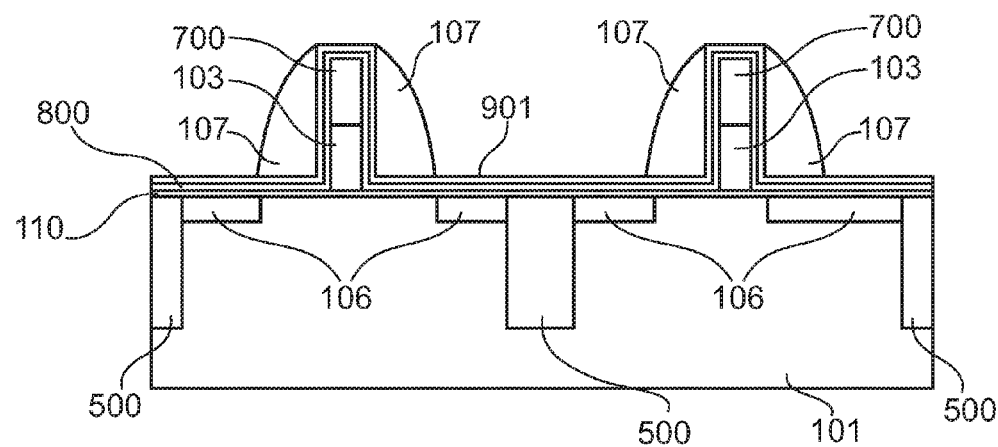

As can be taken from FIG. 12, the oxide spacers 900 are removed as well as the silicon nitride material 801, followed by a further silicon nitride and silicon oxide deposition and silicon oxide spacer formation, thereby forming the second spacers 107 on a silicon nitride layer 901. Thus, the silicon oxide spacers 900 and the silicon nitride layer 801 are etched away, and new spacers 107 are made in the same way of FIG. 8 and FIG. 9.

Figure 13:
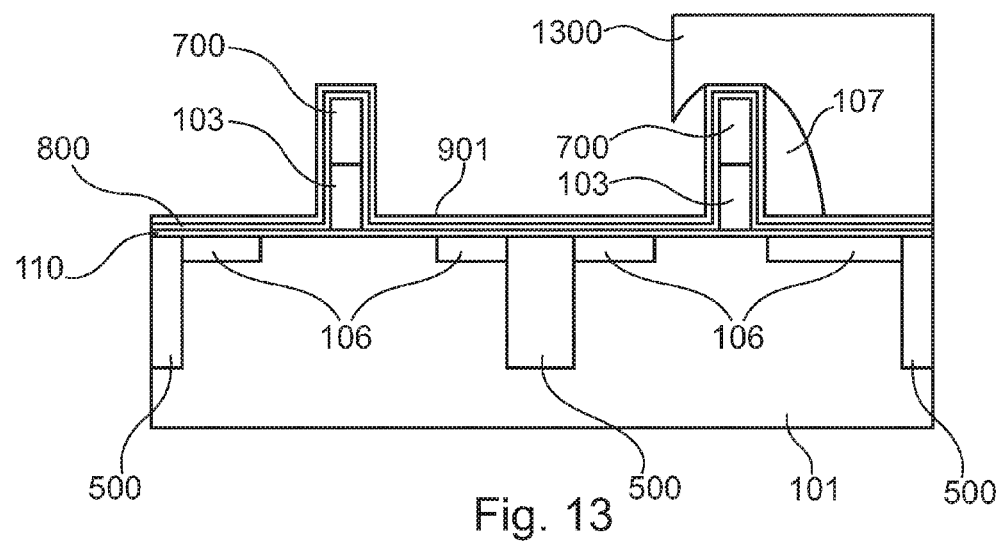

As can be taken from FIG. 13, a resist 1300 is spun, exposed and a wet oxide etch is performed, so that, in a similar manner as described above referring to FIG. 10, the silicon oxide spacer 107 is defined on the drain extension 106.

Figure 14:
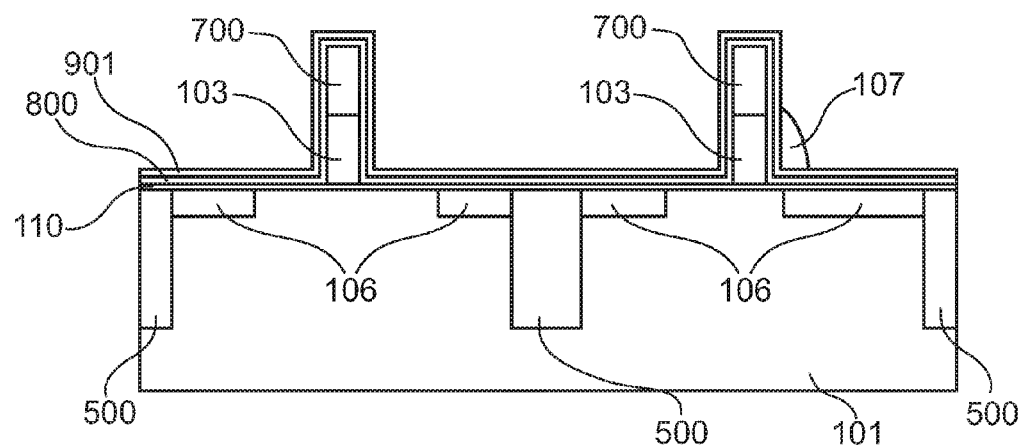

As can be taken from FIG. 14, the remaining silicon oxide spacer 107 on the drain extension 106 is wet etched or recessed to a required drain extension length. This is shown in FIG. 14 showing a reduced second spacer 107. In other words, to obtain the layer sequence of FIG. 14, a wet oxide etching is applied to reduce/recess the oxide spacer 107.

Figure 15:
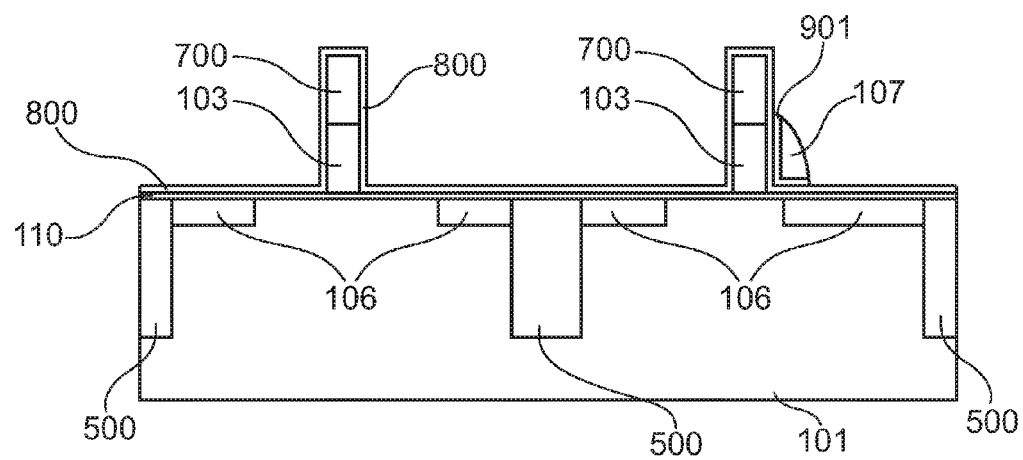

To obtain the layer sequence shown in FIG. 15, a silicon nitride etch is performed to remove the silicon nitride layer 901.

Figure 16:
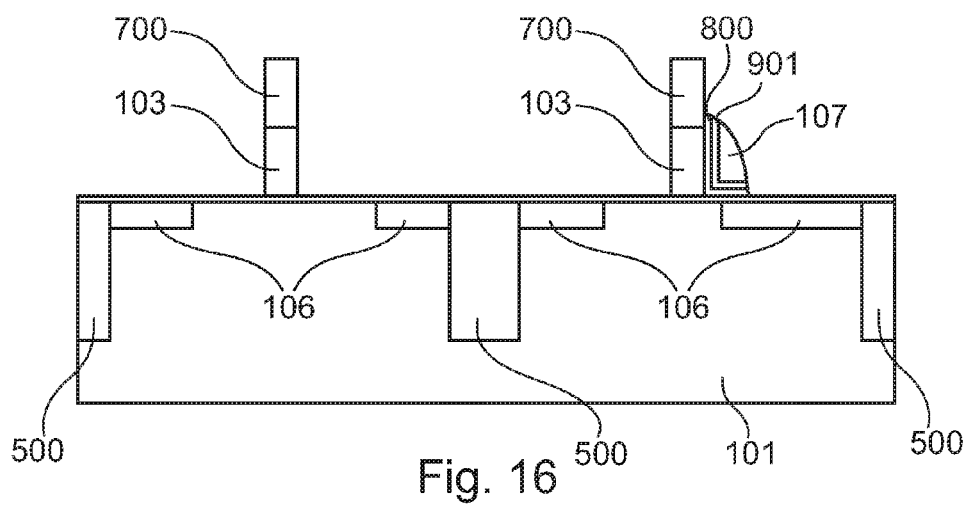

To obtain the layer sequence shown in FIG. 16, a silicon oxide etching is performed to remove the silicon oxide layer 800. The maximum oxide spacer height has to be around the poly gate 103 in order to prevent later the formation of unwanted spacers on the poly gate (see FIG. 20).

Figure 17:
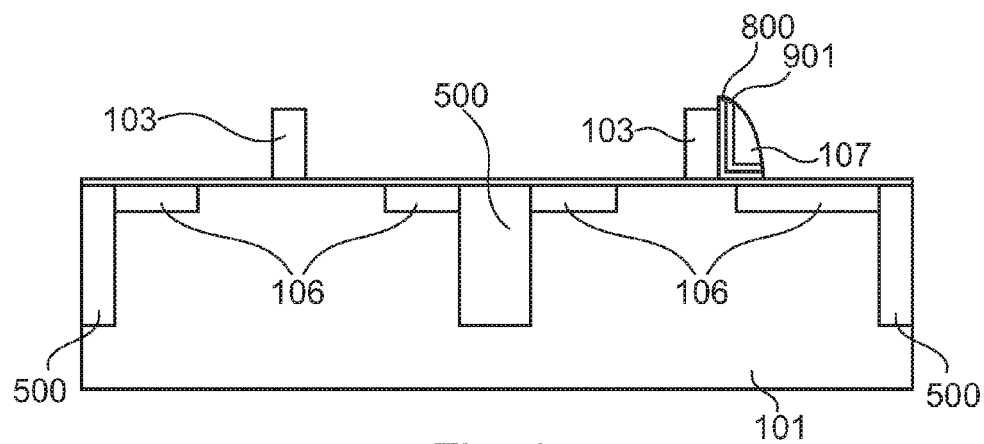

To obtain the layer sequence shown in FIG. 17, the nitride hard mask 700 is removed.

Figure 18:
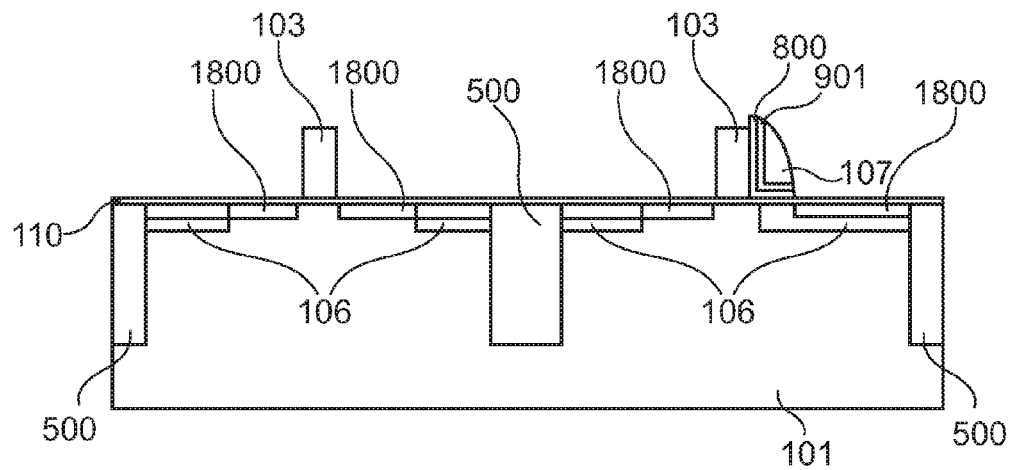

To obtain the layer sequence shown in FIG. 18, a lightly doped drain (LDD) implant 1800 is performed. The lightly doped drain 1800 may have a charge carrier density of, for instance, $10^{14}$ atoms/cm$^2$ or $10^{20}$ atoms/cm$^3$ with a thickness of approximately 20 nm.

Figure 19:
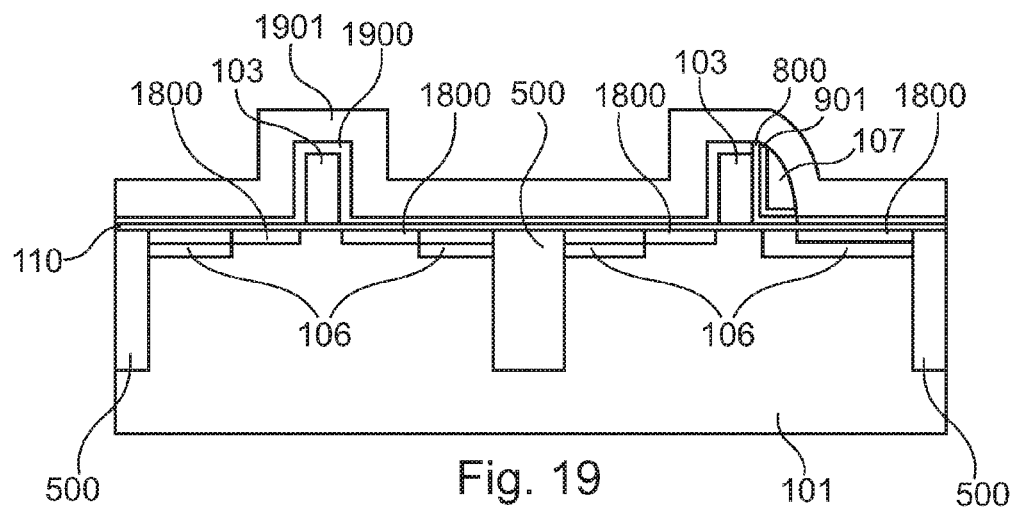

As can be taken from FIG. 19, spacer formation is then performed by performing a standard oxide/nitride deposition, thereby forming a silicon oxide layer 1900 and a silicon nitride layer 1901.

Figure 20:
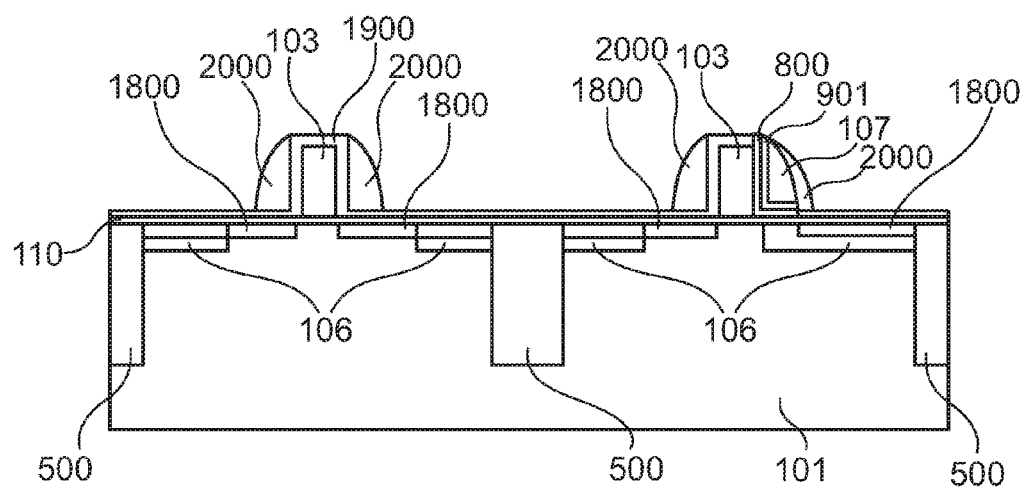

To obtain the layer sequence shown in FIG. 20, a nitride spacer formation is performed to thereby form spacers 2000.

Figure 21:
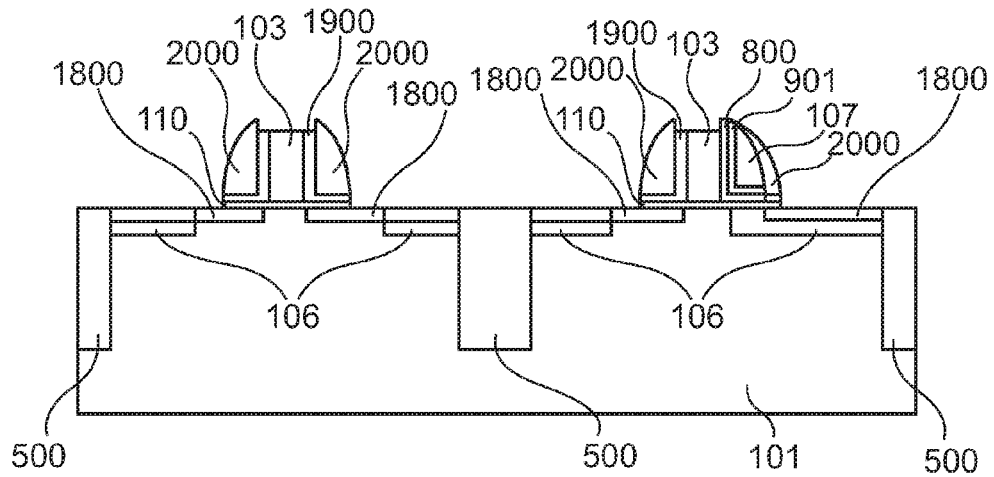

To obtain the layer sequence shown in FIG. 21, a silicon oxide etch is performed.

Figure 22:
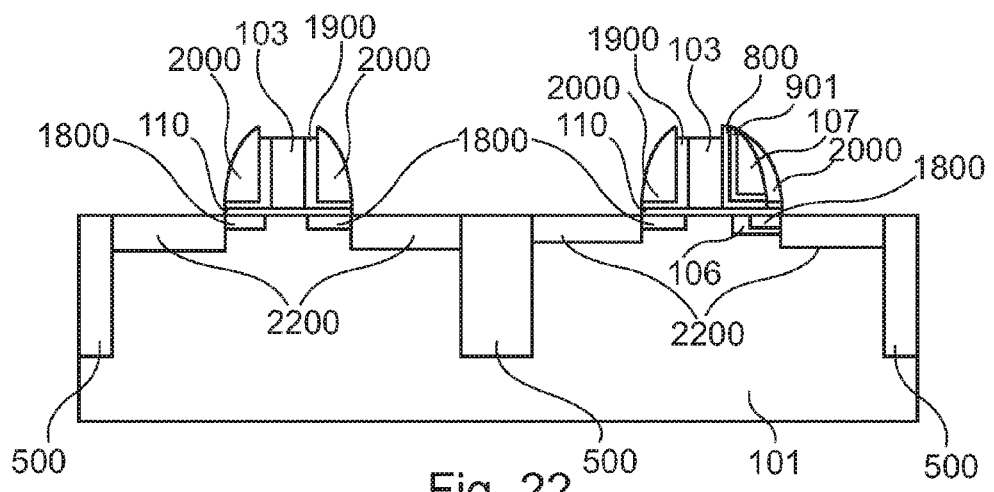

To obtain the layer sequence shown in FIG. 22, a source/drain implant 2200 is performed. The source/drain 2200 may have a charge carrier density of, for instance, $10^{20}$ atoms/cm$^3$ (or a dosis of approximately $10^{15}$ atoms/cm$^2$).

A silicon nitride spacer may also be formed on top of the already existing silicon oxide spacer on the extended drain region 106. The standard source and drain implant 2200 may be followed by silicidation. The spacers 107, 2000 shown in FIG. 22 remain on the extended drain MOSFET as a protection against a subsequent silicidation.

Finally, it should be noted that the above-mentioned embodiments illustrate rather than limit the invention, and that those skilled in the art will be capable of designing many alternative embodiments without departing from the scope of the invention as defined by the appended claims. In the claims, any reference signs placed in parentheses shall not be construed as limiting the claims. The words "comprising" and "comprises", and the like, do not exclude the presence of elements or steps other than those listed in any claim or the specification as a whole. The singular reference of an element does not exclude the plural reference of such elements and vice-versa. In a device claim enumerating several means, several of these means may be embodied by one and the same item of software or hardware. The mere fact that certain measures are recited in mutually different dependent claims does not indicate that a combination of these measures cannot be used to advantage.

The invention claimed is:

1. A method of manufacturing an extended drain transistor, the method comprising
    forming a gate on a substrate;
    forming a first spacer on a first side wall of the gate;
    implanting an extended drain in a surface portion of the substrate, the extended drain is adjacent a second side wall of the gate opposing the first side wall, and the second side wall is free of the first spacer;
    removing the first spacer;
    forming a second spacer on the second side wall of the gate;
    implanting a source in a surface portion of the substrate adjacent the first side wall of the gate, the first side wall is free of the second spacer;
    implanting a drain in a surface portion of the substrate adjacent the second spacer;
    wherein forming the first spacer on the first side wall of the gate comprises:
        depositing a spacer material on the first side wall and on the second side wall of the gate;
        depositing a resist on the substrate, on the gate, and on the spacer material;

removing the resist to expose at least a portion of the gate and the spacer material covering the second side wall of the gate while maintaining the resist on the first side wall of the gate;

etching the exposed spacer material on the second side wall of the gate;

wherein forming the second spacer on the second side wall of the gate comprises:

depositing a new spacer material on the first side wall and on the second side wall of the gate;

depositing a further resist on the substrate, on the gate, and on the new spacer material;

removing the further resist to expose at least a portion of the gate and the new spacer material covering the first side wall of the gate while maintaining the further resist on the second side wall of the gate;

etching the exposed new spacer material on the first side wall of the gate; and further comprising:

removing the remaining portion of the further resist to expose the new spacer material on the second side wall of the gate;

partially etching the exposed new spacer material on the second side wall of the gate to thereby adjust a width of the second spacer on the second side wall of the gate.

2. The method of claim 1, comprising forming a first shallow trench isolation and a second shallow trench isolation in the substrate, wherein the source, the extended drain and the drain are arranged between the first shallow trench isolation and the second shallow trench isolation.

3. The method of claim 1, comprising forming a gate insulating layer between the substrate and the gate.

4. The method of claim 1, comprising forming an electrically insulating structure between the gate and at least one of the group consisting of the first spacer and the second spacer.

5. The method of claim 1, wherein implanting the source comprises forming a lightly doped source portion in the surface portion of the substrate adjacent the first side wall of the gate;

forming a third spacer on the first side wall of the gate;

forming a highly doped source portion in a surface portion of the substrate adjacent the third spacer.

6. The method of claim 1, wherein implanting the drain comprises:

forming a lightly doped drain portion in the surface portion of the substrate adjacent the second spacer;

forming a third spacer on the second spacer;

forming a highly doped drain portion in a surface portion of the substrate adjacent the third spacer.

7. The method of claim 1, wherein implanting the source comprises forming a lightly doped source portion in the surface portion of the substrate adjacent the first side wall of the gate;

wherein implanting the drain comprises forming a lightly doped drain portion in the surface portion of the substrate adjacent the second spacer;

forming a third spacer on the first side wall of the gate and a fourth spacer on the second spacer;

forming a highly doped source portion in a surface portion of the substrate adjacent the third spacer;

forming a highly doped drain portion in a surface portion of the substrate adjacent the fourth spacer;

wherein the lightly doped source portion and the lightly doped drain portion are formed simultaneously by a common implantation procedure.

8. The method of claim 1, wherein implanting the source comprises forming a lightly doped source portion in the surface portion of the substrate adjacent the first side wall of the gate;

wherein implanting the drain comprises forming a lightly doped drain portion in the surface portion of the substrate adjacent the second spacer;

forming a third spacer on the first side wall of the gate and a fourth spacer on the second spacer;

forming a highly doped source portion in a surface portion of the substrate adjacent the third spacer;

forming a highly doped drain portion in a surface portion of the substrate adjacent the fourth spacer;

wherein the highly doped source portion and the highly doped drain portion are formed simultaneously by a common implantation procedure.

9. The method of claim 1, wherein the source is implanted in a surface portion of the substrate directly adjacent the first side wall of the gate.

10. The method of claim 1, wherein the drain is implanted in a surface portion of the substrate directly adjacent the second spacer.

11. The method of claim 1, wherein a width of the second spacer is larger than a lithography overlay of a CMOS process that is used for forming the gate.

12. The method of claim 1, wherein the extended drain transistor is manufactured in an asymmetric manner so that a doping profile of the source lacks mirror-symmetry to a doping profile of the drain.

13. The method of claim 1, wherein the extended drain transistor is manufactured so that the source is free of an extension.

14. A method of manufacturing an extended drain transistor, the method comprising:

forming a gate on a substrate;

forming a first spacer on a first side wall of the gate, wherein forming the first spacer on the first side wall of the gate comprises;

depositing a spacer material on the first side wall and on a second side wall of the gate;

depositing a resist on the substrate, on the gate and on the spacer material;

removing the resist to expose at least a portion of the gate and the spacer material covering the second side wall of the gate while maintaining the resist on the first side wall of the gate; and etching the exposed spacer material on the second side wall of the gate to remove the spacer material at the second side wall;

implanting an extended drain in a surface portion of the substrate adjacent the second side wall of the gate opposing the first side wall;

removing the first spacer;

forming a second spacer on the second side wall of the gate, wherein forming the second spacer on the second side wall of the gate comprises:

depositing a new spacer material on the first side wall and on the second side wall of the gate;

depositing a further resist on the substrate, on the gate, and on the new spacer material;

removing the further resist to expose at least a portion of the gate and the new spacer material covering the first side wall of the gate while maintaining the further resist on the second side wall of the gate; and etching the exposed new spacer material on the first side wall of the gate;

removing the remaining portion of the further resist to expose the new spacer material on the second side wall of the gate; and partially etching the exposed new spacer material on the second side wall of the gate to thereby adjust a width of the second spacer on the second side wall of the gate;

implanting a source in a surface portion of the substrate adjacent the first side wall of the gate being uncovered by the second spacer;

implanting a drain in a surface portion of the substrate adjacent the second spacer.

15. The method of claim 14, wherein implanting the source comprises forming a lightly doped source portion in the surface portion of the substrate adjacent the first side wall of the gate;

forming a third spacer on the first side wall of the gate;

forming a highly doped source portion in a surface portion of the substrate adjacent the third spacer.

16. The method of claim 14, wherein implanting the drain comprises:

forming a lightly doped drain portion in the surface portion of the substrate adjacent the second spacer;

forming a third spacer on the second spacer;

forming a highly doped drain portion in a surface portion of the substrate adjacent the third spacer.

17. The method of claim 14, wherein implanting the source comprises forming a lightly doped source portion in the surface portion of the substrate adjacent the first side wall of the gate;

wherein implanting the drain comprises forming a lightly doped drain portion in the surface portion of the substrate adjacent the second spacer;

forming a third spacer on the first side wall of the gate and a fourth spacer on the second spacer;

forming a highly doped source portion in a surface portion of the substrate adjacent the third spacer;

forming a highly doped drain portion in a surface portion of the substrate adjacent the fourth spacer;

wherein the lightly doped source portion and the lightly doped drain portion are formed simultaneously by a common implantation procedure.

18. The method of claim 14, wherein implanting the source comprises forming a lightly doped source portion in the surface portion of the substrate adjacent the first side wall of the gate;

wherein implanting the drain comprises forming a lightly doped drain portion in the surface portion of the substrate adjacent the second spacer;

forming a third spacer on the first side wall of the gate and a fourth spacer on the second spacer;

forming a highly doped source portion in a surface portion of the substrate adjacent the third spacer;

forming a highly doped drain portion in a surface portion of the substrate adjacent the fourth spacer;

wherein the highly doped source portion and the highly doped drain portion are formed simultaneously by a common implantation procedure.

* * * * *